US006924232B2

(12) United States Patent
Mathew et al.

(10) Patent No.: US 6,924,232 B2
(45) Date of Patent: Aug. 2, 2005

(54) SEMICONDUCTOR PROCESS AND COMPOSITION FOR FORMING A BARRIER MATERIAL OVERLYING COPPER

(75) Inventors: Varughese Mathew, Austin, TX (US); Sam S. Garcia, Austin, TX (US); Christopher M. Prindle, Crolles (FR)

(73) Assignee: Freescale Semiconductor, Inc., Austin, TX (US)

( * ) Notice: Subject to any disclaimer, the term of this patent is extended or adjusted under 35 U.S.C. 154(b) by 6 days.

(21) Appl. No.: 10/650,002

(22) Filed: Aug. 27, 2003

(65) Prior Publication Data

US 2005/0048773 A1 Mar. 3, 2005

(51) Int. Cl.[7] .............................................. H01L 21/44
(52) U.S. Cl. ........................ 438/678; 438/584; 427/123
(58) Field of Search ................................ 438/678, 584, 438/685, 686, 687; 427/123, 97.9, 126.6

(56) References Cited

U.S. PATENT DOCUMENTS

| | | | |
|---|---|---|---|
| 5,695,810 A | | 12/1997 | Dubin et al. |
| 5,755,859 A | * | 5/1998 | Brusic et al. ............... 106/1.22 |
| 6,528,409 B1 | | 3/2003 | Lopatin et al. |
| 6,551,856 B1 | * | 4/2003 | Lee ............................. 438/108 |
| 6,645,567 B2 | * | 11/2003 | Chebiam et al. ......... 427/443.1 |
| 6,797,312 B2 | * | 9/2004 | Kong et al. .................... 427/58 |
| 2003/0111729 A1 | | 6/2003 | Leu et al. |
| 2003/0113576 A1 | | 6/2003 | Chebiam et al. |

OTHER PUBLICATIONS

Itabashi et al., "Electroless Deposited CoWB for Copper Diffusion Barrier Metal," *Proceedings of the IEEE 2002 International Interconnect Technology Conference (Cat. No. 02EX519)*, 2002, pp. 285–287.

Duch et al., "Development and Characterization of Co–Ni Alloys for Microsystems Applications," *Journal of the Electrochemical Society*, 2002, 149(4), pp. C201–C208.

Homma et al., "Microstructural Study of Electroless–Plated CoNiP Ternary Alloy Films for Perpendicular Magnetic Recording Media," *IEEE Transactions on Magnetics*, Nov. 1991, 27(6), pp. 4909–4911.

Kohn et al., "Characterization of Electroless Deposited Co(W,P) Thin Films for Encapsulation of Copper Metallization," *Materials Science and Engineering*, 2001, A302, pp. 18–25.

Kohn et al., "Evaluation of Electroless Deposited Co(W,P) Thin Films as Diffusion Barriers for Copper Metallization," *Microelectronic Engineering*, 2001, 55, pp. 297–303.

Petrov et al., "Electrochemical Study of the Electroless Deposition of Co(P) and Co (W,P) Alloys," *Journal of the Electrochemical Society*, 2002, 149(4), C187–C194.

(Continued)

*Primary Examiner*—Caridad Everhart
(74) *Attorney, Agent, or Firm*—Michael P. Noonan; Robert L. King

(57) ABSTRACT

An electroless plating process for forming a barrier film such as a cobalt tungsten boron film on copper interconnects lines of semiconductor wafers uses a plating bath of morpholine borane which provides higher thermal stability and range, allowing for greater compatibility with low k dielectric materials. Mixed chelating agents with different stability constants with a metal source are used to complex base metal such as copper which dissolves into solution, if any. A fluorosurfactant is used as a wetting agent and stabilizer.

20 Claims, 1 Drawing Sheet

OTHER PUBLICATIONS

Osaka et al., "Fabrication of Electroless NiReP Barrier Layer on $SiO_2$ without Sputtered Seed Layer," *Electrochemical and Solid–State Letters*, 2002, 5(1), pp. C7–C10.

O'Sullivan et al.,, "Electrolessly Deposited Diffusion Barriers for Microelectronics," *IBM Journal of Research and Development*, Sep. 1998, vol. 42, No. 5, pp. 607–620.

Segawa et al., "Manufacturing–ready Selectivity of CoWP Capping on Damascene Copper Interconnects," *Advanced Metallization Conference 2001, AMC 2001 Proceedings of the Conference*, pp. 567–572.

Shacham–Diamand et al., "Electroless Co(W,P) and Co(Mo,P) Deposition for Cu Metallization Applications," *IEEE, 2001 6th International Conference on Solid State and Integrated Circuit Technology*, vol. 1, 2001, pp. 410–415.

Shacham–Diamand et al., "Electroless Deposition of Thin–Film Cobalt–Tungsten–Phosphorus Layers Using Tungsten Phosphoric Acid ($H_3[P(W_3O_{10})_4]$) for ULSI and MEMS Application," *Journal of the Electrochemical Society*, 2001, 148(3), pp. C162–C167.

Shacham–Diamand et al., "Material Properties of Electroless 100–200 nm Thick CoWP Films," *Electrochemical Technology Applications in Electronics Proceedings of the Third International Symposium Electrochemical Society Proceedings*, 2000, vol. 99–34, pp. 102–110.

\* cited by examiner

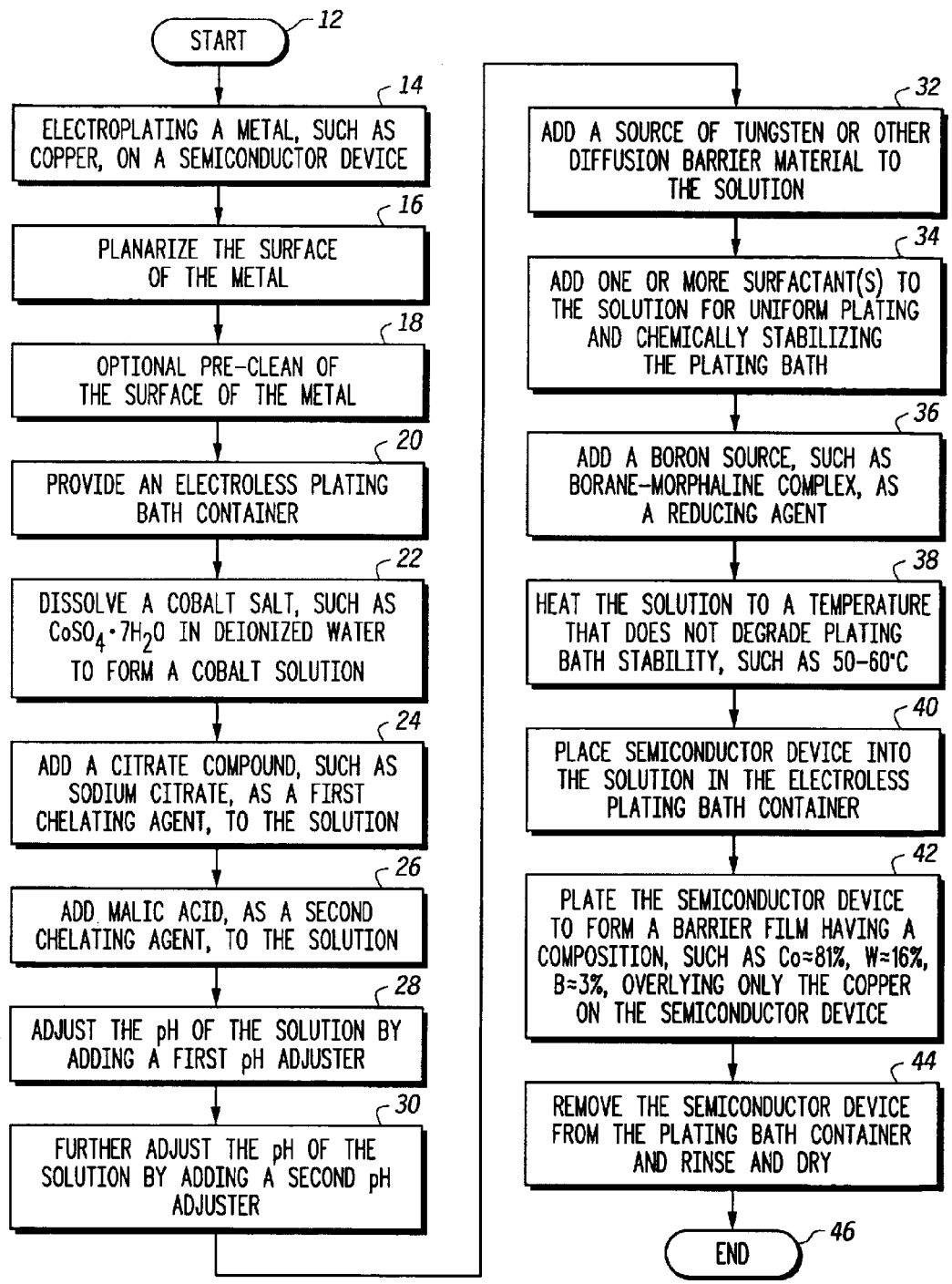
*FIGURE*

SEMICONDUCTOR PROCESS AND COMPOSITION FOR FORMING A BARRIER MATERIAL OVERLYING COPPER

BACKGROUND

1. Field

The present invention relates to formation (e.g., deposition) of films in devices such as semiconductor and integrated circuit devices, and, more particularly, to diffusion barrier films in semiconductor devices.

2. Description of the Related Art

The semiconductor industry is constantly searching for ways to increase the speed of integrated circuits. For example, faster interconnect technology such as copper interconnects provide an improvement over older technologies since copper provides a faster signal medium.

In integrated circuits, a dielectric layer is used to provide insulation around the interconnect wiring of the chip. Just as faster interconnect materials such as copper allow a signal to move faster through the chip, decreasing the capacitance factor of the insulating material also allows signals to travel across the interconnect faster because they have less interference with each other. The most common dielectric material is silicon dioxide. However, the semiconductor industry is constantly searching for commercially useful, lower capacitance dielectric materials, commonly referred to as low dielectric constant or low k materials.

Conventional cobalt (Co) films doped with elements like tungsten (W), molybdenum (Mo), rhenium (Re), etc. are reported to have barrier properties to prevent diffusion of copper into a surrounding dielectric material. This can enable integration of copper with low k materials. Also capping copper with these types of materials can enhance reliability by increasing electromigration resistance. In order to be successful a very selective deposition of these films is required.

Electroless deposition is one method for selective deposition. Many barrier formation techniques require catalytic activation which often has problems of selectivity due to a high probability of nucleation in non-metal area. Non-activation barrier deposition processes typically require operating temperatures which are relatively higher for conventional electroless methods, and such higher temperatures reduce the chemical stability of electroless plating baths. Since alkaline solutions are employed as plating baths, better compatibility with low k dielectric materials could be achieved at lower temperatures. Thus, there is a need for an efficient and effective means of capping copper interconnect structures with diffusion barrier material.

BRIEF DESCRIPTION OF THE DRAWINGS

The present invention may be better understood, and its numerous objects, features, and advantages made apparent to those skilled in the art, by referencing the accompanying FIGURE. The FIGURE is a flowchart illustrating an exemplary process for forming a barrier material overlying copper.

DETAILED DESCRIPTION OF THE PREFERRED EMBODIMENT(S)

The following discussion is intended to provide a detailed description of at least one example of the invention and should not be taken to be limiting of the invention itself. Rather, any number of variations may fall within the scope of the invention which is properly defined in the claims following this description.

In one embodiment, a method for forming an integrated circuit is provided. The integrated circuit uses a copper interconnect structure which includes copper contacts in a first metal layer coupled to copper contacts in a second metal layer. The copper contacts are coupled in accordance with the circuit design by copper vias providing an electrical coupling therebetween. The integrated circuit also includes a dielectric material such as silicon dioxide or a low-k material disposed around the copper contacts and vias. To prevent diffusion of copper from the contacts and vias, a barrier material is formed between the low k material and the contacts and vias.

The FIGURE shows a method for selectively forming such a barrier material overlying copper. The method allows the formation of a barrier material which provides the desired copper diffusion barrier while not unduly affecting electrical performance (e.g., by introducing excessive resistivity adjacent to or between the copper contacts and vias). The barrier material may be formed selectively over copper so that additional process steps are not required to remove the barrier material from other portions of the integrated circuit.

As shown in the FIGURE, a metal such as copper is formed in the integrated circuit at electroplating step 14. After electroplating the metal on a semiconductor device such as a wafer including the integrated circuit, the copper is annealed, and then the surface of the metal is smoothed and polished during planarize step 16. For example, the metal may be smoothed using a chemical-mechanical polishing (CMP) technique.

After step 16, the metal may be pre-cleaned to remove impurities introduced into the metal during planarizing step 16. Although pre-cleaning is commonplace, and therefore well known by those of ordinary skill in the art, pre-cleaning step 18 is optional in the presently discussed embodiment. Pre-cleaning is not necessary for subsequent device plating due in part to a combination of chelating agents and other plating bath components disclosed herein and discussed in greater detail below. Rather, pre-cleaning may be useful, for example, to maintain the purity of the electroless plating bath which is also discussed in greater detail below.

After steps 14 and/or 16, the semiconductor device is ready to have the barrier film applied. The barrier film is selectively formed on the semiconductor device over the metal locations using a process composition such as an electroless plating bath which is placed in an electroless plating bath container provided during step 22.

The electroless plating bath is prepared during steps 22–38. At various stages, the electroless plating bath includes one or more of each of the following substances: a source of metal, a chelating agent, a reducing agent, a pH adjusting agent, and a surfactant and/or wetting agent. The electroless solution may also include one or more stabilizers, buffers, or other materials known in the art.

In the embodiment of FIG. 1, a metal source is provided during step 22. For example, a metal carrying substance is dissolved in a solvent to provide a metal solution. Specifically in the shown embodiment, a cobalt carrying substance is dissolved in a purified solvent such as deionized water to form a cobalt metal solution. The cobalt carrying substance provides the cobalt for the CoWB barrier film which is to be formed over the copper interconnect of the above mentioned integrated circuit. Exemplary cobalt carrying substances include cobalt salts such as cobalt sulfate $CoSO_4 \cdot 7H_2O$ or cobalt chloride $CoCl_2 \cdot 6H_2O$. In one embodiment, the cobalt-containing compound comprises cobalt sulfate hepta hydrate and is approximately 27 to 35 grams per liter of compound.

Cobalt has good adhesion to copper and low resistance, but other materials may be used, for example, if selective formation of the resulting barrier material is still attainable with such materials. For example, nickel, or even a nickel-cobalt alloy, may be used in place of cobalt alone. Other nickel group elements and cobalt group elements may be used individually or in combination. Each substitute element may by used as the sole substitute or in combination with cobalt, or in combination with other respective substitutes.

After the cobalt salt is dissolved during step 22, a chelating agent is added to the solution. Chelating agents help bind the cobalt metal, for example, in solution until it is needed for plating. The binding function facilitates a more robust manufacturing process. In the shown embodiment, a first chelating agent is added to the solution during step 24 and a second chelating agent is added during step 26. The use of two chelating agents provides certain heretofore unrealized advantages in some embodiments. For example, a plating bath may be created which includes a mixture of chelating agents in which the stability constant of one chelating agent is higher than another of the chelating agents. A first chelating agent provides the above described binding function of the metal source solution, while the lower stability of a second chelating agent is available for the removal of any dissolved interconnect metal such as copper and any other inhibitors which may be present on the surface. This prevents accumulation of free copper ions and co-deposition with the barrier film. Thus, for example, during step 24, a chelating agent is added which complexes or chelates well with the metal source provided during step 22 to help hold the metal in solution. Also, during step 26 a second chelating agent is added which complexes or chelates well with the metal which was electroplated during step 14.

For further example, a citrate compound may be added during step 22 to more strongly chelate with cobalt than with other elements. Exemplary citrate compounds include sodium citrate or citric acid. Exemplary concentrations include approximately 27 to 35 grams per liter of tri-sodium citrate compound or approximately 25 to 30 grams per liter of citric acid. Sodium can have some undesirable end effects, but in controlled amounts, it provides the advantage in increased solubility. Also, malic acid may be added during step 24 to more strongly chelate with any copper which reaches solution than with the cobalt in the solution. An exemplary concentration of malic acid is approximately 27 to 35 grams per liter of compound. Some exemplary chelating agents which may be used in place of or in combination with malic acid include tartrate compounds, glycine and oxalic acid.

After the chelating agent(s) are added during steps 24 and/or 26, a pH adjusting agent is added to the solution. In one embodiment, a pH level of approximately 9, or even more specifically 9.6, is preferable, but a range of pH levels is allowable in many cases, typically above 8, and in any case, alkaline. One exemplary range of pH is approximately 8.5 to 10 or even to 11. Another predetermined acceptable range of pH levels includes pH levels from approximately 9.0 through 10.0.

In the shown embodiment, a first pH adjuster is added to the solution during step 28 and a second pH adjuster is added during step 30. The use of two pH adjusters provides certain heretofore unrealized advantages in some embodiments. For example, a first pH adjuster is added during step 28 which is intended to adjust the pH of the solution and to effectively aid the plating rate during step 40 discussed in greater detail below. One example of such a pH adjuster is tetramethyl ammonium hydroxide (TMAH) which may, for further example, be added to be approximately 1.0 percent to 1.5 percent of solution. Also, during step 30 a second pH adjuster is added to further adjust the pH of the solution. One example of such a second pH adjuster is potassium hydroxide (KOH) which may be added in an amount required to bring the pH of the composition to a predetermined pH. The use of two pH adjusters such as TMAH and the KOH in the plating solution provides, in addition to an adjusting effect, a buffering effect which tends to resist changes in pH level. The TMAH, the KOH and/or other pH adjusters may be premixed prior to adding to the solution and added in a single step. Ammonia may be used in place of TMAH and KOH.

After the pH of the solution is adjusted during step(s) 28 and/or 30, a diffusion barrier material source is added to the solution during step 32. In the illustrated embodiment, a tungsten source is added to the solution. One exemplary tungsten source is sodium tungstate dihydrate ($Na_2WO_4 \cdot 2H_2O$) which may be added to approximately 8 to 12 grams per liter of compound. Another is tungstic acid which may be added to approximately 6 to 10 grams per liter of compound. Other materials or elements may be used in place of tungsten. For example, molybdenum may be used to provide an additional diffusion barrier effect. Other chromium group elements can also be used as substitutes for tungsten. In other embodiments, rhenium or other manganese group elements may be used. Other substitutes for tungsten include refractory metals such as Niobium and Tantalum. In another embodiment, zirconium may be used as a substitute for tungsten. Other members of the groups of the above elements may be used, and each substitute element may by used as the sole substitute or in combination with tungsten, or in combination with other respective substitutes.

After the diffusion barrier element is added during step 32, one or more surfactants are added to the solution during step 34. The surfactants are added to aid the occurrence of uniform plating and to chemically stabilize the electroless plating bath. These surfactants may be added to approximately 20 to 100 parts per million (ppm) of compound. One such surfactant is an alkoxylated amine (e.g., alkoxylated diamine) commercially available from BASF under the registered trademark of Tetronic®. Another such surfactant is a polyglycol (e.g., polyoxypropylene-polyoxyethelene block copolymer) commercially available from BASF under the registered trademark of Pluronic®.

In one embodiment, a fluorosurfactant is added to the solution. In addition to its normal functions of wetting the semiconductor device and stabilizing the solution, the fluorosurfactant seems to aid the transmission of tungsten into the barrier film, thereby increasing its tungsten concentration. One such surfactant is fluoroalkyl alcohol substituted monoether with polyethylene glycol commercially available from DuPont under the registered trademark of Zonyl®. The fluorosurfactant may be used alone or in combination with other surfactants. The fluorosurfactant may be added to approximately 15 to 40 parts per million (ppm) of compound.

After the surfactant(s) are added during step 34, a boron source is added during step 36. The boron source is used as a reducing agent. A reducing agent is a source of electrons for the plating step of step 40, and allows the plating step to be electroless. One such boron source is dimethyl aminoborane (DMAB). Another such boron source is a borane-morpholine complex (sometimes referred to as morpholine borane) which may be added to approximately 5 to 8 grams per liter of compound. Morpholine borane provides high solution stability at higher temperatures, and allows plating to occur at lower temperatures.

After the boron source is added during step 36, the temperature of the solution is adjusted to a value that does not degrade plating bath stability. For example, the solution may be heated during step 38 to a plating temperature of 55° C., or to a temperature within the range from 50° C. to 55° C., or even to 60° C. Other temperatures may be used. Preferably, the temperature will not go below a minimum value below which plating cannot occur and will not go above a maximum value above which stability of the solution degrades unacceptably. Higher temperatures allow better plating rates, but must be balanced in view of maintaining solution stability. Higher temperature plating may require that solutions be replaced more often than otherwise would be required.

After the electroless plating bath is prepared during steps 20–38, the semiconductor device is immersed in the electroless plating bath solution. This can be performed by placing the semiconductor device into the solution in the electroless plating bath container already including the electroless plating bath as shown in the FIGURE at place step 40. The semiconductor device may be immersed in any other appropriate way. For example, it is common to flow the solution in contact with the semiconductor device. The semiconductor device may be immersed by holding the device (e.g., stationary, relatively or absolutely, or otherwise in known position(s)), and spraying the device and/or its environs, or pumping electroless plating solution into the container or otherwise raising the level of the electroless plating solution to immerse or otherwise cover the semiconductor device. The semiconductor device may be spun to enhance the plating effect.

After the semiconductor device is immersed in the electroless plating bath solution during immersion step 40, the semiconductor device is plated to form a diffusion barrier film during plate step 42. The diffusion barrier film may be comprised of a combination of conductive and diffusion barrier materials. In one embodiment, the barrier film includes a low resistive transition metal to support the placement of diffusion barrier elements.

In the presently discussed embodiment, the barrier material includes cobalt (Co), tungsten (W) and boron (B) to provide a CoWB barrier. The percentage of each element present in the barrier material may be managed so that the overall barrier material exhibits sufficient diffusion blocking but does not unduly effect the electrical characteristics of the integrated circuit. For example, in the CoWB embodiment, each of the cobalt, tungsten, and boron, provide some diffusion barrier effects, but decreasing the amounts of tungsten and boron below a certain amount will allow an unacceptable amount of copper diffusion through the cobalt. The boron is not necessary, but the presence of boron in the barrier film enhances the barrier efficiency, thereby potentially eliminating the need for an increased amount of the tungsten. Accordingly, more tungsten and boron in the barrier material results in a greater diffusion barrier effect being exhibited by the barrier material. In contrast, a greater percentage amount of cobalt (and therefore less tungsten and boron) results in greater conductivity being exhibited by the barrier material with less diffusion blocking.

In one embodiment, the barrier material includes 80% cobalt, 17% tungsten and 3% boron. In one embodiment, the percentage of tungsten is 16%. In other embodiments, the tungsten percentage varies from 10% to 17%, or even from 9% to 22%. In another embodiment, the percentage of boron is 2%. In other embodiments, the percentage of cobalt varies from 80% to 85%, or from 75% to 85% or even to 88%. Percentages of cobalt, tungsten and boron outside the above specified ranges may be used with the understanding that lower concentrations of tungsten and boron lowers the barrier effect of the barrier material, while higher concentrations of the tungsten and boron (with consequent lower concentrations of cobalt) may have undesirable electrical effects such as an unacceptable or otherwise degrading increase in resistance of the barrier layer.

After the diffusion barrier film is plated during plating step 42, the semiconductor device is removed from the plating bath during remove step 44. The semiconductor device may then be rinsed and dried during step 44. Alternatively, or in addition, the semiconductor device may be prepared for other processing steps as desired.

The above described embodiment sometimes employs the use of sodium-based compounds. In such an embodiment, the solution would include compounds such as cobalt sulfate, sodium citrate, malic acid, TMAH, KOH, sodium tungstate along with various surfactants. However, sometimes it is useful to have a sodium free solution. Such a sodium free bath could include compounds such as cobalt sulfate, citric acid, malic acid, TMAH, Tungstic acid along with various surfactants.

Thus, a process for forming a cobalt tungsten boron film on copper interconnects lines of semiconductor wafers is disclosed. A plating bath of morpholine borane, which has higher thermal stability compared to normally used dimethylaminoboranes for cobalt-tungsten plating is described. The bath can operate at a lower temperature (50° C. vs. 75° C.) and hence provides greater compatibility with low k dielectric materials, which are sensitive to alkaline solutions at elevated temperatures. Lower operating temperature also enables novel plating methods like one-time use of electrolytes. The use of morpholine borane also results in reduced chances of depletion of reducing agent. Mixed chelating agents with different stability constants with cobalt are used to complex dissolved copper in solution, if any. A fluorosurfactant is used in smaller (ppm) amounts as wetting agent and stabilizer. The plating bath can deposit CoWB films very selectively on copper.

The techniques taught herein could be used for advance device generations below 0.1-micron especially useful for copper-low k dielectric integration in which copper diffusion barriers are necessary. Also the techniques enhance device reliability in general. The use of copper caps as taught herein can also find applications in metal-insulator-metal (MIM) capacitors.

In one embodiment, a semiconductor process includes some or all of the following steps: providing an electroless plating bath container; dissolving a nickel- or cobalt-containing material in water to form a solution having at least one of nickel and cobalt; adding a first chelating agent to the solution, the first chelating agent having a first stability constant; adding a second chelating agent to the solution, the second chelating agent having a second stability constant different from the first stability constant, the first chelating agent and the second chelating agent functioning to keep the at least one of nickel and cobalt suspended in the solution; adding first and second pH adjusters to the solution to increase pH of the solution, the first and second pH adjusters having different compositions with different pH factors and functioning as buffering agents; adding a diffusion barrier material to the solution; adding at least one surfactant to the solution for enhancing uniformity of plating and chemically stabilizing the solution; adding a boron-containing material to the solution to convert the at least one of nickel and cobalt in the nickel or cobalt-containing material to a solid form; heating the solution to a predetermined temperature; placing a semiconductor device having exposed metal into the electroless plating bath container; plating the semiconductor device to form a barrier film overlying the exposed metal, the barrier film comprising a combination of boron, the diffusion barrier material and at least one of nickel and cobalt; and removing the semiconductor device from the solution.

In another further embodiment, the process includes the step of adding one of malic acid, tartrate, glycine and oxalic acid as the second chelating agent for stabilizing the solution and preferably chelating any dissolved metal.

In yet another further embodiment of the process, the step of forming of the exposed metal of the semiconductor device includes the steps of electroplating the exposed metal on the semiconductor device, planarizing a surface of the exposed metal, and pre-cleaning the exposed metal.

In yet another further embodiment, the process includes the step of using at least one of tungsten, chromium, molybdenum, rhenium and zirconium as the diffusion barrier material.

In yet another further embodiment, the process includes the step of using copper as the exposed metal.

In yet another further embodiment of the process, the nickel- or cobalt-containing material further comprises one of cobalt chloride and cobalt sulfate.

In yet another further embodiment, the process includes the step of adding a first surfactant and a second surfactant having different stabilization parameters than the first surfactant.

In yet another further embodiment, the process includes the step of implementing the first surfactant as a fluoroalkyl alcohol substituted polyethylene glycol and the step of implementing the second surfactant as one of alkoxylated amines and polyglycol.

In another embodiment, a process composition for electroless plating of a film of diffusion barrier material onto copper is provided. The process composition includes the following: a cobalt-containing compound; a first chelating agent for preferentially chelating the cobalt; a second chelating agent which is different from the first chelating agent and which preferentially chelates any dissolved metal in the composition; a first pH adjuster for buffering the composition and adjusting the pH of the composition by a predetermined amount; a tungsten-containing compound to provide a first metallic source; a first surfactant having a first surface tension reducing characteristic, the first surfactant enhancing an amount of tungsten deposition in the film of diffusion barrier material; and a second surfactant having a second surface tension reducing characteristic, the second surfactant improving uniformity of deposition of the film of diffusion barrier material. In a further embodiment, the process composition further includes a second pH adjuster for further buffering the composition and further adjusting the pH of the composition to have a predetermined pH.

In another embodiment, a semiconductor process solution is provided for use in electroless plating of a film of diffusion barrier material onto copper. The semiconductor process solution includes the following: a compound containing a metal; a first chelating agent for preferentially chelating the metal; a second chelating agent which is different from the first chelating agent and which preferentially chelates any other metal in the composition; a first pH adjuster for buffering the composition and adjusting the pH of the composition by a predetermined amount; a tungsten-containing compound to provide a first metallic source; a first surfactant having a first surface tension reducing characteristic, the first surfactant enhancing an amount of tungsten deposition in the film of diffusion barrier material; and a second surfactant having a second surface tension reducing characteristic, the second surfactant improving uniformity of deposition of the film of diffusion barrier material. In a further embodiment, the metal of the semiconductor process solution includes at least one of cobalt and nickel. In another further embodiment, the semiconductor process solution includes a boron-containing compound to provide a boron source to function as a reducing agent.

The above description is intended to describe at least one embodiment of the invention. The above description is not intended to define the scope of the invention. Rather, the scope of the invention is defined in the claims below. Thus, other embodiments of the invention include other variations, modifications, additions, and/or improvements to the above description.

The foregoing operations and materials are used herein as examples for sake of conceptual clarity to teach and enable the practice of the invention claimed below. Consequently, as used herein these specific exemplars are intended to be representative of their more general classes. Furthermore, in general, the use of any specific exemplar herein is also intended to be representative of its class and the noninclusion of any specific devices in any exemplary lists herein should not be taken as indicating that limitation is desired.

Furthermore, those skilled in the art will recognize that boundaries between the functionality of the above described steps or operations are illustrative. The functionality of multiple operations may be combined into a single operation, and/or the functionality of a single operations may be distributed in additional operations. Moreover, alternative embodiments may include multiple instances of a particular operation, and the order of operations may be altered in various other embodiments unless specifically limited in the claims.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." Thus, as used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended in the below claims, such an intent will be explicitly recited in the claim, and in the absence of such recitation no such limitation is present or intended. For example, in the claims below, when a claim element is described as having "one" feature, it is intended that the element be limited to one and only one of the feature described. Furthermore, when a claim element is described in the claims below as including or comprising "a" feature, it is not intended that the element be limited to one and only one of the feature described. Rather, for example, the claim including "a" feature reads upon an apparatus or method including one or more of the feature in question. That is, because the apparatus or method in question includes a feature, the claim reads on the apparatus or method regardless of whether the apparatus or method includes another such similar feature. This use of the word "a" as a nonlimiting, introductory article to a feature of a claim is adopted herein by Applicants as being identical to the interpretation adopted by the majority of courts in the past, and is adopted notwithstanding any anomalous or precedential case law to the contrary that may be found. Similarly, when a claim element is described in the claims below as including or comprising an aforementioned feature (e.g., "the" feature), it is intended that the element not be limited to one and only one of the feature described merely by the incidental use of the definite article.

Furthermore, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Based on the teachings herein, those skilled in the art will readily implement the steps necessary to provide the structures and the methods disclosed herein, and will understand that the process parameters, materials, dimensions, and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims.

While particular embodiments of the present invention have been shown and described, it will be obvious to those skilled in the art that, based upon the teachings herein, various modifications, alternative constructions, and equivalents may be used without departing from the invention claimed herein. Consequently, the appended claims encompass within their scope all such changes, modifications, etc. as are within the true spirit and scope of the invention. Furthermore, it is to be understood that the invention is solely defined by the appended claims. The above description is not intended to present an exhaustive list of embodiments of the invention. Unless expressly stated otherwise, each example presented herein is a nonlimiting or nonexclusive example, whether or not the terms nonlimiting, nonexclusive or similar terms are contemporaneously expressed with each example. Although an attempt has been made to outline some exemplary embodiments and exemplary variations thereto, other embodiments and/or variations are within the scope of the invention as defined in the claims below.

What is claimed is:

1. A semiconductor process comprising:
   providing an electroless plating bath container;
   dissolving a nickel- or cobalt-containing material in water to form a solution having at least one of nickel and cobalt;
   adding a first chelating agent to the solution, the first chelating agent having a first stability constant;
   adding a second chelating agent to the solution, the second chelating agent having a second stability constant different from the first stability constant, the first chelating agent and the second chelating agent functioning to keep the at least one of nickel and cobalt suspended in the solution;
   adding first and second pH adjusters to the solution to increase pH of the solution, the first and second pH adjusters having different compositions with different pH factors and functioning as buffering agents;
   adding a diffusion barrier material to the solution;
   adding at least one surfactant to the solution for enhancing uniformity of plating and chemically stabilizing the solution;
   adding a boron-containing material to the solution to convert the at least one of nickel and cobalt in the nickel or cobalt-containing material to a solid form;
   heating the solution to a predetermined temperature;
   placing a semiconductor device having exposed metal into the electroless plating bath container;
   plating the semiconductor device to form a barrier film overlying the exposed metal, the barrier film comprising a combination of boron, the diffusion barrier material and at least one of nickel and cobalt; and
   removing the semiconductor device from the solution.

2. The process of claim 1 further comprising:
   adding a citrate compound as the first chelating agent.

3. The process of claim 2 further comprising adding sodium citrate as the first chelating agent.

4. The process of claim 1 further comprising:
   adding one of malic acid, tartrate, glycine and oxalic acid as the second chelating agent for stabilizing the solution and preferably chelating any dissolved metal.

5. The process of claim 1 wherein forming the exposed metal of the semiconductor device further comprises electroplating the exposed metal on the semiconductor device, planarizing a surface of the exposed metal and pre-cleaning the exposed metal.

6. The process of claim 1 further comprising using tungsten, chromium, molybdenum, rhenium and zirconium as the diffusion barrier material.

7. The process of claim 1 further comprising using copper as the exposed metal.

8. The process of claim 1 further comprising heating the solution to the predetermined temperature of substantially in a range of fifty degrees Centigrade to sixty degrees Centigrade.

9. The process of claim 1 wherein the nickel- or cobalt-containing material further comprises one of cobalt chloride and cobalt sulfate.

10. The process of claim 1 further comprising adding a first surfactant and a second surfactant having different stabilization parameters than the first surfactant.

11. The process of claim 10 further comprising implementing the first surfactant as a fluoroalkyl alcohol substituted polyethylene glycol and implementing the second surfactant as one of alkoxylated amines and polyglycol.

12. In a process for a semiconductor, a process composition for electroless plating of a film of diffusion barrier material onto copper comprising:
   a cobalt-containing compound;
   a first chelating agent for preferentially chelating the cobalt;
   a second chelating agent which is different from the first chelating agent and which preferentially chelates any dissolved metal in the composition;
   a first pH adjuster for buffering the composition and adjusting the pH of the composition by a predetermined amount;

a tungsten-containing compound to provide a first metallic source;

a first surfactant having a first surface tension reducing characteristic, the first surfactant enhancing an amount of tungsten deposition in the film of diffusion barrier material; and a second surfactant having a second surface tension reducing characteristic, the second surfactant improving uniformity of deposition of the film of diffusion barrier material.

13. In the process of claim 12 wherein the compound further comprises:

a boron-containing compound to provide a boron source to function as a reducing agent.

14. In the process of claim 13 wherein the cobalt-containing compound comprises cobalt sulfate hepta hydrate and is approximately 27 to 35 grams per liter of compound;

the first chelating agent comprises one of tri-sodium citrate in approximately 27 to 35 grams per liter of compound or citric acid in approximately 25 to 30 grams per liter;

the second chelating agent comprises malic acid and is approximately 27 to 35 grams per liter of compound;

the first pH adjuster comprises tetramethyl ammonium hydroxide (TMAH) and is approximately 1.0 percent to 1.5 percent of compound;

the second pH adjuster comprises potassium hydroxide in an amount required to bring the pH of the composition to the predetermined pH;

the tungsten-containing compound comprises one of sodium tungstate dihydrate in approximately 8 to 12 grams per liter of compound or tungstic acid in approximately 6 to 10 grams per liter of compound;

the first surfactant comprises approximately 15 to 40 parts per million (ppm) of compound;

the second surfactant comprises approximately 20 to 100 parts per million (ppm) of compound; and the boron-containing compound comprises morpholine borane and is approximately 5 to 8 grams per liter of compound.

15. In the process of claim 12 wherein the first chelating agent comprises a citrate compound and the second chelating agent comprises one of malic acid, tartrate, glycine and oxalic acid.

16. In the process of claim 12 wherein the compound further comprises:

a second pH adjuster for further buffering the composition and further adjusting the pH of the composition to have a predetermined pH.

17. In the process of claim 14 wherein the predetermined pH is in a range from approximately 9.0 through 10.0.

18. A semiconductor process solution for use in electroless plating of a film of diffusion barrier material onto copper comprising:

a compound containing a metal;

a first chelating agent for preferentially chelating the metal;

a second chelating agent which is different from the first chelating agent and which preferentially chelates any other metal in the composition;

a first pH adjuster for buffering the composition and adjusting the pH of the composition by a predetermined amount;

a tungsten-containing compound to provide a first metallic source;

a first surfactant having a first surface tension reducing characteristic, the first surfactant enhancing an amount of tungsten deposition in the film of diffusion barrier material; and a second surfactant having a second surface tension reducing characteristic, the second surfactant improving uniformity of deposition of the film of diffusion barrier material.

19. The semiconductor process solution of claim 18 wherein the metal further comprises at least one of cobalt and nickel.

20. The semiconductor process solution of claim 18 further comprises:

a boron-containing compound to provide a boron source to function as a reducing agent.

* * * * *